United States Patent [19]

Havemose

[11] Patent Number: 5,412,667
[45] Date of Patent: May 2, 1995

[54] DECODER FOR CROSS INTERLEAVED ERROR CORRECTING ENCODED DATA

[75] Inventor: Allan Havemose, Exton, Pa.

[73] Assignee: Commodore Electronics Limited, West Chester, Pa.

[21] Appl. No.: 88,745

[22] Filed: Jul. 8, 1993

[51] Int. Cl.⁶ .................. G06F 11/10; H03M 13/00
[52] U.S. Cl. .................................. 371/37.5; 371/37.4
[58] Field of Search ............... 371/37.5, 37.2, 37.4, 371/2.1, 40.3

[56] References Cited

U.S. PATENT DOCUMENTS

| | | | |
|---|---|---|---|
| 4,433,415 | 2/1984 | Kojima | 371/40.3 |
| 4,541,092 | 9/1985 | Sako et al. | 371/40.3 |
| 4,646,301 | 2/1987 | Okamoto et al. | 371/37.4 |
| 4,998,252 | 3/1991 | Suzuki et al. | 371/37.5 |

OTHER PUBLICATIONS

Arai et al., "High Capability Error Correction LSI for CD Player and CD ROM", *IEEE Transactions on Consumer Electronics,* vol. CE-30, No. 3, pp. 353-359 (Aug. 1984).

Kim et al., "Decoding Strategies for Reed-Solomon Product Codes: Application to Digital Video Recording Systems," IEEE Transactions on Consumer Electronics, vol. 38, No. 3, pp. 243-246 (Aug. 1992).

*Primary Examiner*—Paul P. Gordon
*Assistant Examiner*—Emmanuel Moise
*Attorney, Agent, or Firm*—Ratner & Prestia

[57] ABSTRACT

An improved method for processing a sector of data read from a CD-ROM which has been encoded using a cross-interleaved Reed Solomon (CIRS) code is time linear in the number of errors in the sector. The improved method iteratively processes the data values from the sector, which appear in each of the sets of cross-interleaved sequences, through an error detection/correction algorithm. In the first pass, a syndrome is generated for each sequence in each set. If the syndrome indicates that the sequence either contains no errors or an undetectable number of errors, the sequence is marked as being error-free. If a sequence contains a correctable error, the error is corrected and the sequence is marked as being error-free. If the syndrome indicates that the sequence contains a number of errors which may be detected but not corrected the sequence is marked as containing errors. After the first pass the improved method only calculates an error syndrome for the sequences which are marked as containing errors. The sequences in this subset are those which are determined by the method to possibly contain an error. If an error is corrected in a sequence from one of the sets during any of the passes, the sequence from the cross-interleaved set which includes the error-corrected value is marked as containing errors to ensure that its syndrome is recalculated during the next pass.

7 Claims, 7 Drawing Sheets

| M/N | 0 | 1 | 2 | 3 | 4 | ... | 40 | 41 | 42 | Q0 | Q1 |
|---|---|---|---|---|---|---|---|---|---|---|---|
| 0 | 0000 | 0044 | 0088 | 0132 | 0176 | .... | 0642 | 0686 | 0730 | 1118 | 1144 |
| 1 | 0043 | 0087 | 0131 | 0175 | 0219 | .... | 0685 | 0729 | 0773 | 1119 | 1145 |
| 2 | 0086 | 0130 | 0174 | 0218 | 0262 | .... | 0728 | 0772 | 0816 | 1120 | 1146 |
| 3 | 0129 | 0173 | 0217 | 0261 | 0305 | .... | 0771 | 0815 | 0859 | 1121 | 1147 |
| 4 | 0172 | 0216 | 0260 | 0304 | 0348 | .... | 0814 | 0858 | 0902 | 1122 | 1148 |
| . | . | . | . | . | . | .... | . | . | . | . | . |
| . | . | . | . | . | . | .... | . | . | . | . | . |
| . | . | . | . | . | . | .... | . | . | . | . | . |
| . | . | . | . | . | . | .... | . | . | . | . | . |
| . | . | . | . | . | . | .... | . | . | . | . | . |
| 22 | 0946 | 0990 | 1034 | 1078 | 0004 | .... | 0470 | 0514 | 0558 | 1140 | 1166 |
| 23 | 0989 | 1033 | 1077 | 0003 | 0047 | .... | 0513 | 0557 | 0601 | 1141 | 1167 |
| 24 | 1032 | 1076 | 0002 | 0046 | 0090 | .... | 0556 | 0600 | 0644 | 1142 | 1168 |
| 25 | 1075 | 0001 | 0045 | 0089 | 0133 | .... | 0599 | 0643 | 0687 | 1143 | 1169 |

DECODER FOR CROSS INTERLEAVED ERROR CORRECTING ENCODED DATA

BACKGROUND OF THE INVENTION

The present invention concerns apparatus and a method for decoding data which has been encoded for error detection and correction using a cross-interleaved Reed-Solomon code, and in particular, to a Reed-Solomon decoder which performs a reduced number of computations compared to conventional decoding methods.

Compact disk read-only memory (CD-ROM) computer peripheral devices, based on compact disk (CD) audio players have been available for many years. These devices recover recorded digital data from a compact disk. CD-ROM data, recorded on the compact disk, is in a different format than audio information. The different format is needed because the recording of digital data on the compact disk must meet requirements that did not need to be addressed when data representing audio signals was recorded on the disk, namely, the ability to recover the data with a very low error rate.

The error rate for audio data may be higher than for general digital data because conventional error concealment techniques may be used effectively for audio data. These techniques assume that the data is changing slowly with respect to the sample rate; that each data value can be reconstructed as some function of the data values that surround it. An exemplary error concealment technique would be to infer the value of an erroneous audio sample by interpolating between two adjacent correct samples.

This redundancy cannot be relied upon, however to recover digital data from a CD-ROM device. While there may be some redundancy if the data is audio data or video data, there is generally no redundancy in other types of data that may be recorded on a CD-ROM device, such as an encyclopedia article or a tables of values.

To ensure accurate reproduction of the data recorded on a CD-ROM, therefore, the data is encoded using a complex error correcting code known as an cross-interleaved Reed-Solomon (CIRS) code before it is recorded.

Details on the data format used to record data on CD-ROMs may be found in U.S. Pat. No. 4,998,252 entitled, METHOD AND APPARATUS FOR TRANSMITTING DIGITAL DATA which is hereby incorporated by reference for its teachings on CD-ROM data decoding techniques.

FIG. 1 (prior art) is a data structure diagram of a CD-ROM data sector. As shown in this Figure, each sector includes seven data fields: a SYNCH field, a HEADER field, a DATA field, an Error Detection Code (EDC) field, an empty (SPACE) field, a P-PARITY field and a Q-PARITY field.

As shown in FIG. 2 (prior art), the SYNCH field includes a first zero-value byte followed by 10 bytes of all-ones and then, another zero-valued byte. The HEADER field includes four one-byte subfields. The first two of these, MIN and SEC, give the absolute time displacement of the sector from the beginning of the disk if the sectors were replayed sequentially. This may be used as an address to locate the sector. The next byte, SECTOR, uniquely identifies the sector and a final byte, MODE, describes the type of data that is recorded in the sector. This byte is used in an audio CD to signal the player that the data is in audio format and it is used in a CD-ROM device to indicate that the data is in CD-ROM format.

After the header, the remaining data values in the sector are identified as bytes from byte D0001 to byte D2336. Referring to FIG. 1, some of these are user data bytes and others are the EDC, SPACE, P PARITY AND Q PARITY fields of the sector.

As shown in FIG. 2, each sector may be divided into two parts, one (R-ch) which holds 16-bit right-channel data and one (L-ch) which holds 16-bit left-channel data. This terminology is a remnant of the audio CD data format; data in a CD-ROM sector may be split across the left and right channels. The data values stored on a CD-ROM are 16-bit values, having a most significant byte (MSB) and a least significant byte (LSB). As described below, one of the data scrambling techniques used to effectively compensate for errors which affect a block of adjacent data values is to apply the error correcting codes (i.e. P PARITY and Q PARITY) separately to the MSB's and to the LSB's. In the materials that follow, the MSB values of a sector are referred to as being in the MSB plane and the LSB values are referred to as being in the LSB plane.

FIG. 3 (prior art) is a data structure diagram of a matrix 310 which illustrates the process of applying the error correcting codes to one of these planes. As shown in FIG. 3, the header and user data information in this plane occupy 1032 bytes (bytes 0 through 1031). These bytes are arranged in a matrix of 24 rows by 43 columns. As shown in the Figure, an individual P PARITY value is generated from data values (i.e. a P sequence) taken along one columns of the matrix as illustrated by the arrow 310. In the same way, each of the Q PARITY values is generated from a sequence of values (i.e. a Q sequence) taken along a matrix diagonal, as illustrated by the arrow 312.

The P PARITY values include 86 bytes which relate to the 43 matrix columns as shown in FIG. 3 (i.e. 2 bytes per column). The Q PARITY values include 52 bytes, each pair of bytes generated from 43 values taken along a respectively different one of 26 matrix diagonals.

Both the P PARITY and Q PARITY values, hereinafter referred to collectively as the P series and Q series, respectively, are generated using Reed-Solomon codes. The particular code used to generate the P series is a (26,24) code over a Galois field of 256 (i.e. GF (256)). The generating polynomial for GF (256) is $x^8+x^4+x^3+x^2+1$ and the primitive element $\alpha$ of GF(256) is given by the vector (0,0,0,0,0,0,1,0) over GF(2), most significant bit to least significant bit. This code corrects 1 GF(256) error and detects 2 GF(256) errors. The parity check matrix HP is given by equation (1)

$$HP = \begin{bmatrix} 1 & 1 & \ldots & 1 & 1 & 1 \\ \alpha^{25} & \alpha^{24} & \ldots & \alpha^2 & \alpha^1 & 1 \end{bmatrix} \quad (1)$$

The parity check matrix HP is applied a set of vectors, VP(i), representing respectively different columns the matrix shown in FIG. 25. The column vector is multiplied by the parity check matrix to produce a syndrome SP(i) according to equation (2).

$$SP(i) = HP \times VP(i) \quad (2)$$

If the value of the syndrome SP(i) is zero, there are either no errors in the column i or there are more than two errors. If the syndrome is non-zero it may indicate a bit location in the corresponding column of bytes has a one-bit error, which can be corrected, or a multi-bit error, which cannot. While the syndrome may have a zero value for some sets of three or more errors in a column, it may also have a non-zero value. All columns having two erroneous bits will produce a non-zero syndrome.

The Q series is generated from a (45,43) Reed Solomon code over GF(256). This code also corrects 1 and detects 2 GF(256) errors. The parity check matrix, HQ, is given by equation (3).

$$HQ = \begin{bmatrix} 1 & 1 & \ldots & 1 & 1 & 1 \\ \alpha^{44} & \alpha^{43} & \ldots & \alpha^2 & \alpha^1 & 1 \end{bmatrix} \quad (3)$$

As described above, the Q codes are generated from values along the diagonals of the matrix of digital values. This matrix 310 includes the header and user data values from the sector 110 and the P PARITY values. If the Q PARITY values are removed from the matrix 310 and each column, 1 through 42, of the matrix is circularly shifted upward by its column index (i.e. column 1 is circularly shifted by one position, column 2 by two positions, etc.) and if the Q-PARITY values are appended to the ends of the rows of the shifted matrix, the result is a matrix 310' shown in FIG. 4. This matrix represents the Q PARITY values as being calculated from data values taken along the rows of the shifted matrix. This representation defines the data values used to calculate the Q series.

As described above for the P codes, a set of syndromes, SQ(j), are generated, one for each row, j, of the matrix 310' by multiplying a vector of values vQ(j), taken along the row j of the shifted matrix 310', by the parity check matrix HQ. This operation is illustrated by equation (4).

$$SQ(j) = HQ \times VQ(j) \quad (4)$$

A conventional system for recovering data from a CD-ROM including a CIRS decoding system is shown in FIG. 5 (prior art). This is but one of many possible hardware implementations of a CIRS decoding system. It includes a microcontroller 510 which is connected by a system bus 520 to a random access memory (RAM) 512, a P decoder circuit 514, a Q decoder circuit 516 and CD-ROM controller 522. The controller 522 is connected, in turn, to a CD-ROM drive 524. Sectors are read from the CD-ROM drive 524 by the CD-ROM controller responsive to commands issued by the microcontroller 510. Each sector is written into memory and sequentially decoded using the P and Q decoder circuits 514 and 516.

The method used to decode the sector data is shown in the flow-chart diagram of FIG. 6 (prior art). According to this method, responsive to commands from a microprocessor 510, each data sector is read from the CD-ROM reader 524 via the controller 522 and stored into a random-access memory (RAM) 512. The data in the sector is demodulated and deinterleaved by the CD-ROM controller before it is written into the RAM 512.

The microprocessor 510 then directs the MSB plane of the header and user data contained in the sector to a P decoder 514. As described above with reference to Equations (1) and (2), the P decoder at step 610 of the process shown in FIG. 6, multiplies the parity check matrix HP by vectors VP(i) each corresponding to a respective p sequence having address values which correspond to the columns of the matrix 310 shown in FIG. 3. Each of the sequences VP(i) includes the P PARITY values but not the Q PARITY values in the column i of the matrix 310. The result of applying the MSB plane to generate a series of syndrome values, one for each column of the matrix.

As described above, if the value of the syndrome SP(i) is zero, it is assumed that there are no errors to correct in the header and user data values having the addresses indicated by column i of the matrix 310. A zero-valued syndrome may also be generated if the column of values has three or more single-bit errors. If the value of the syndrome is non-zero then there is either a one-bit error which can be detected and corrected or a multi-bit error, which can only be detected. The P decoder 514 at step 610 corrects any one-bit errors in the data and records any columns that have multiple errors that may be detected but not corrected.

Next, by step 612 of the method shown in FIG. 6, the microprocessor 510 passes the header and user data values to the Q decoder 516. As illustrated by step 612, and Equations (3) and (4), the Q decoder 516 applies the Q parity check matrix to each of the Q sequences and the corresponding Q parity values to produce a series of Q syndromes, SQ(j) one for each row j in the matrix 310', shown in FIG. 4.

As with the P-syndrome, a value of zero for the syndrome SQ(j) indicates no error in the corresponding sequence of Q values (i.e. row j of the matrix 310') or, possibly an undetectable error of three or more bits in the sequence of values. A non-zero syndrome value indicates a correctable error or a detectable error. The one-bit errors are corrected by the Q decoder 516 at step 612 of the method shown in FIG. 6. Also indications of any detected errors which cannot be corrected are saved and associated with the particular Q sequence from which the syndromes were generated.

At step 614 of the method, the microprocessor 10 checks the stored information on P errors and Q errors. If no uncorrectable errors were found in all of the P and Q sequences, then the method shown in FIG. 6 returns a value indicating that the decoder was successful and the MSB plane of the header and user data in the plane of the sector is marked as being error-free.

If, however, any of the P or Q sequences is marked as containing an error, then control is transferred to step 616 which increments an iteration count. At step 618, if the iteration count is less than a maximum number of allowed iterations, control is transferred to step 610 to recalculate the P-syndromes for each column of the matrix.

After repeating the P decoding and correction step 610, the Q decoding and correction step 612 is repeated. These decoding steps are repeated because an uncorrectable multi-bit error which was detected in the Q sequence may have been made correctable by the correction of an error in a common term of one or more of the Q sequences and vice-versa. The syndrome for each column and each diagonal of header and user data is recalculated to ensure that any zero-valued syndromes that may have represented three or more single-bit errors in one of the sequences are processed. If one or more of the errors was corrected during the evaluation of the other set of sequences, the syndrome may be non-zero when it is recalculated.

If, during any of the passes, no P sequence errors and no Q sequence errors are detected at step 614, the MSB plane is stored into the RAM 512 with an indication that it is error-free. If, however, an error in either the P sequence or the Q sequence exists after the maximum number of iterations through the data, the MSB data is stored in to the RAM 512 with an indication that it contains uncorrectable errors. The process described above is repeated for the LSB plane of data.

It is noted that the P decoder 514 and Q decoder 516 are separate and distinct hardware components. The number of operations which must be performed for each received CD-ROM sector make it impractical to implement these functions in software, running on the microcontroller 510.

The standard CIRS decoding algorithm described above, is linear in the number of passes over the matrix of header and user data values. There is, in general, no simple relationship between an arbitrary error pattern in the matrix and the number of passes $N_D$ needed to completely decode the data in the matrix. One estimate which may be used, however, is given by expectation (5).

$$N_D = \text{Min} \left( \text{Max (number of non-zero elements)}, \atop PEV \right. \quad (5)$$

$$\left. \text{Max (number of non-zero elements)}) + 1 \atop QEV \right.$$

Where PEV indicates that the maximum operation is applied over all P-code error vectors and QEV indicates that the maximum operation is applied over all Q-code error vectors.

Exemplary times for executing this algorithm are given in Table 1. These times are normalized such that the amount of time used to calculate each syndrome of each sequence in the two sets is represented by a value of unity.

TABLE 1

| Errors | 0 | 1 | 2 | 4 | 8 | 12 |
|---|---|---|---|---|---|---|
| Iterations | 1 | 1 | 2 | 3 | 4 | 5 |
| Normalized Execution Time | 1.00 | 1.00 | 1.91 | 2.88 | 3.84 | 4.79 |

The results of tests performed by the inventor confirm that the decoding method described above is approximately linear in the number of times that the P sequences and Q sequences are processed.

SUMMARY OF THE INVENTION

The present invention is embodied in apparatus and a method for efficiently decoding data which has been encoded in first and second distinct sets sequences, having common members, according to an error-correcting encoding algorithm. The present invention includes the steps of processing all of the sequences in each of the two sets to correct any errors which can be corrected according to the error correcting code. When an individual error in any one of the sequences is corrected, the method determines which sequence in the other set contains the corrected error. This sequence is then marked for evaluation during a subsequent pass through the sequences of the other set. Only those sequences which are marked for evaluation are processed through the error correcting algorithm.

BRIEF DESCRIPTION OF THE DRAWINGS

FIG. 4 (prior art) is a data structure diagram which illustrates an exemplary organization of the data values in the sector and which is isomorphic to the organization shown in FIG. 3.

FIG./5 (prior art) is a block diagram of exemplary circuitry suitable for use in decoding the data in the sectors shown in FIGS. 1-4.

Figure 1:
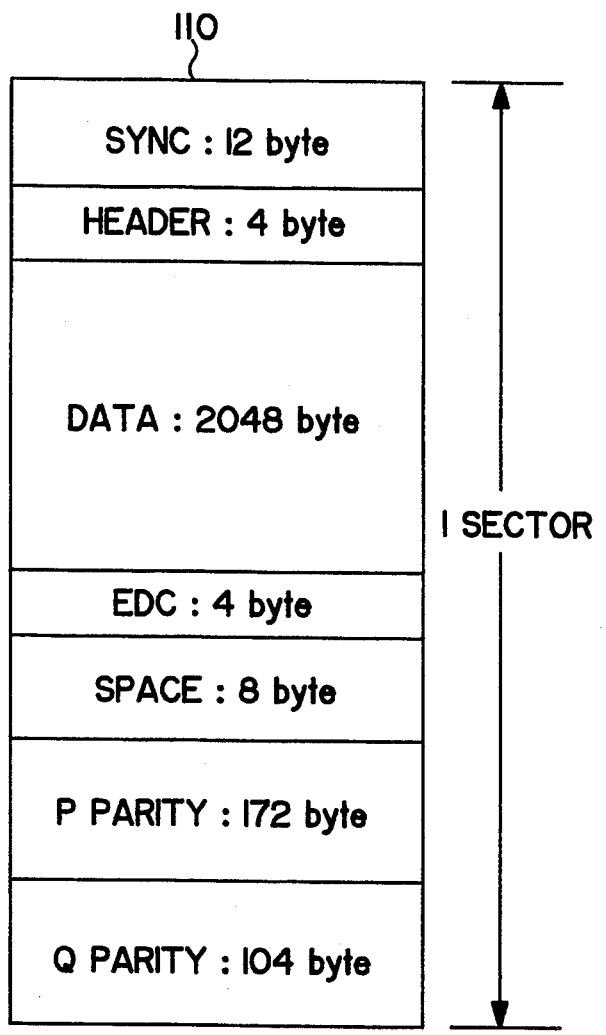
FIG. 1 (prior art) is a data structure diagram which illustrates the format of a CD-ROM sector.
Figure 2:
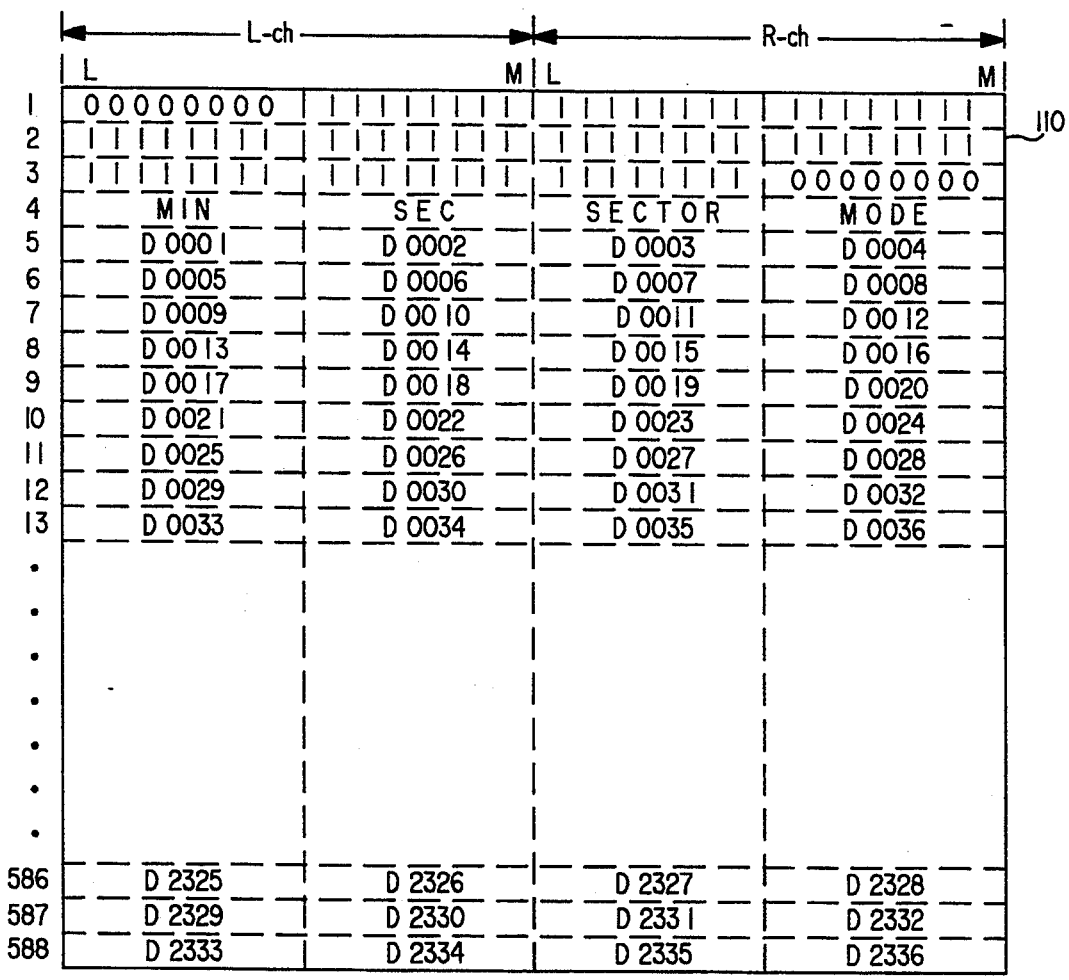
FIG. 2 (prior art) is a data structure diagram which shows the location and function of individual data values in the sector shown in FIG. 1.
Figure 3:
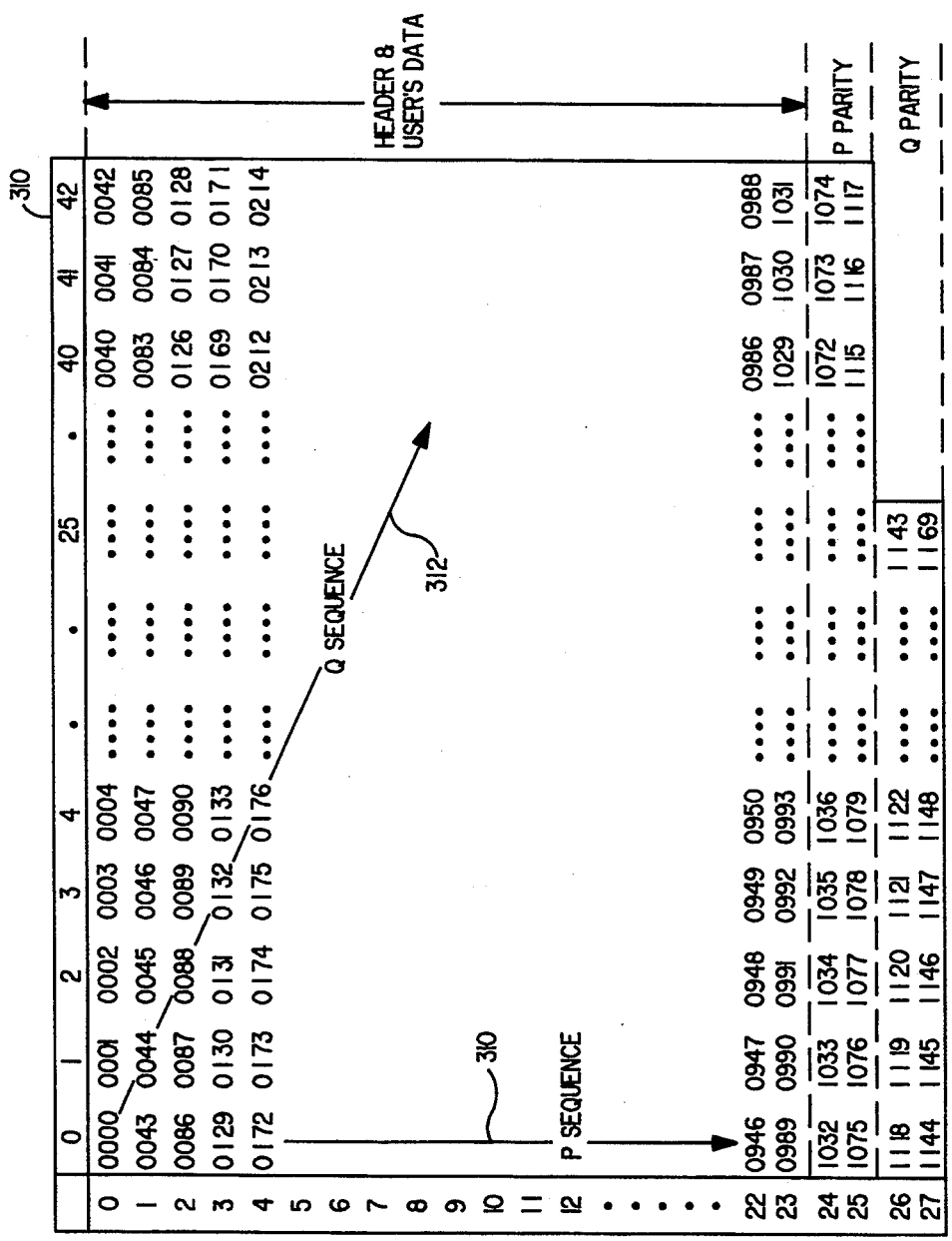
FIG. 3 (prior art) is a data structure diagram which illustrates an exemplary organization of data values in a CD-ROM sector for applying a cross-interleaved Reed Solomon (CIRS) error correcting code to the data values.
Figure 5:
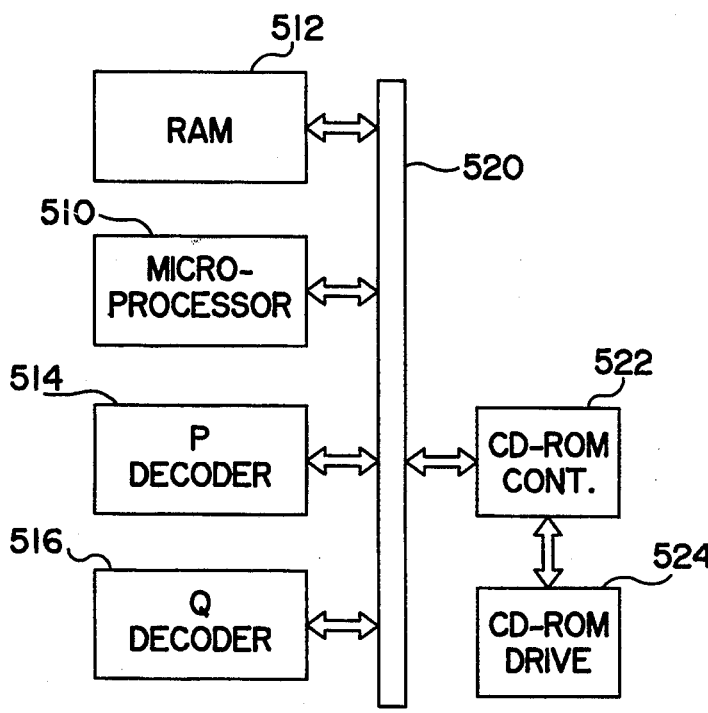
Figure 6:
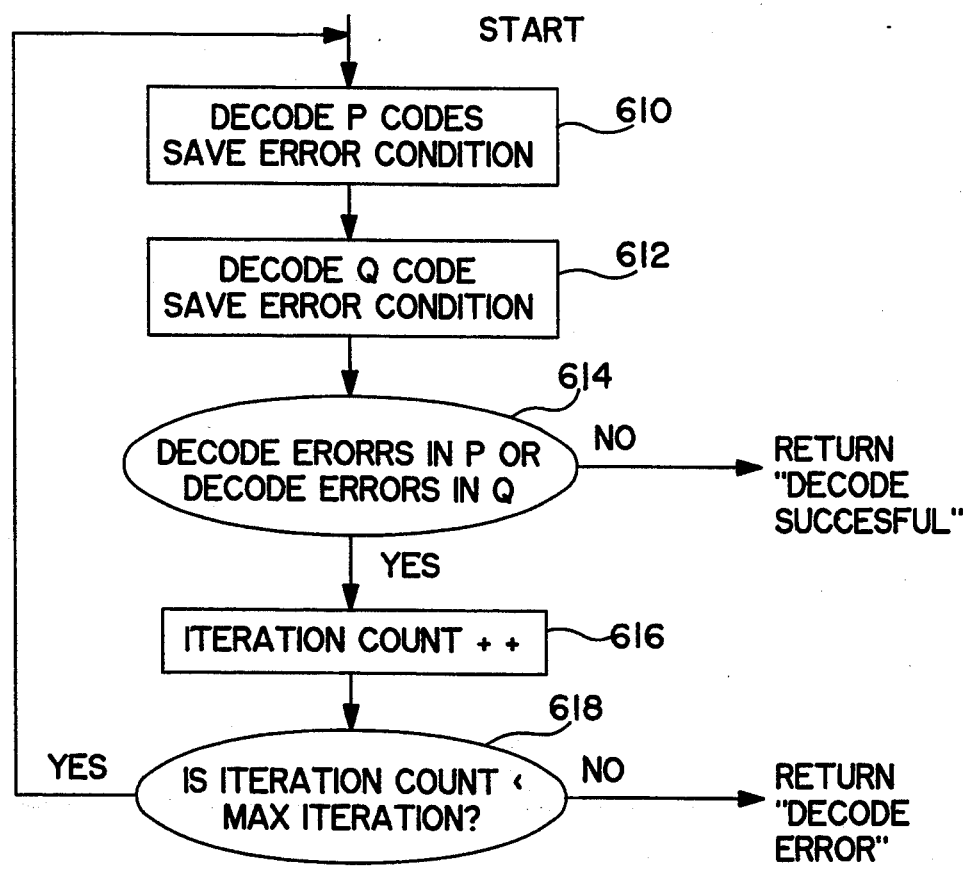

FIG. 6 (prior art) is a flow-chart diagram which illustrates a conventional CIRS decoding method that may be used with the circuitry shown in FIG. 5.

Figure 7:
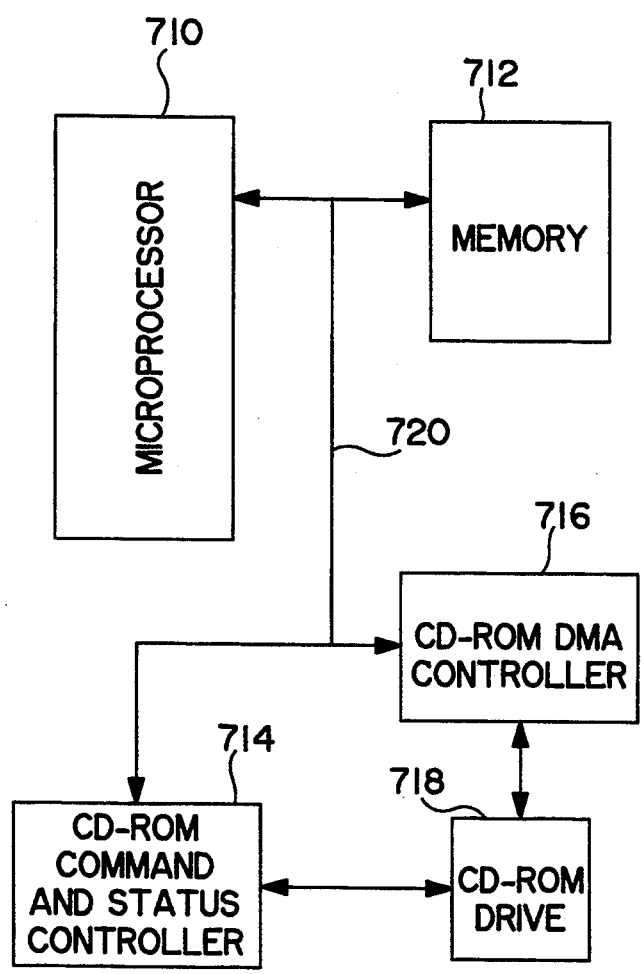

FIG. 7 is a block diagram of exemplary circuitry suitable for decoding the data shown in FIGS. 1-4 using a method according to the present invention.

Figure 8:
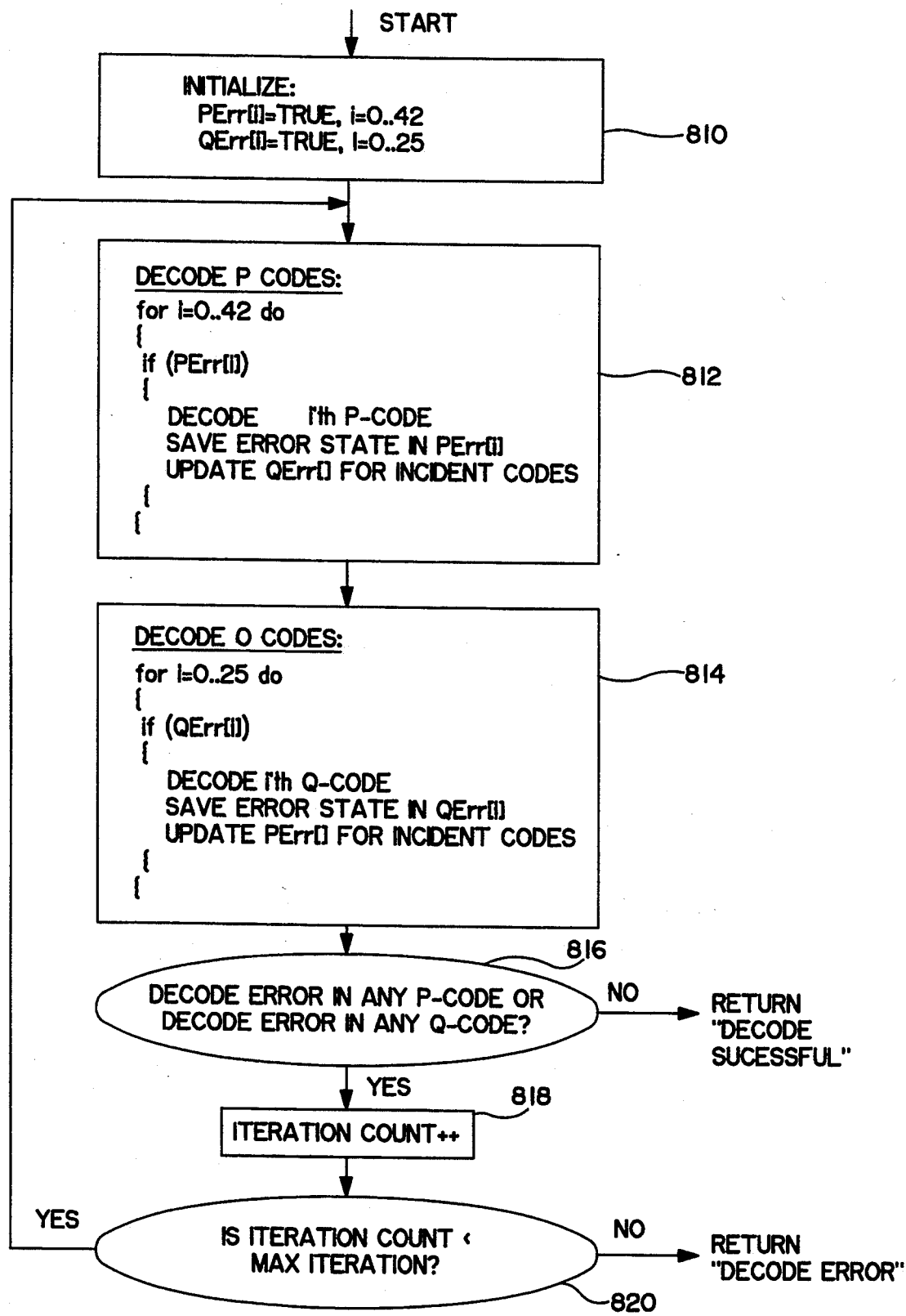

FIG. 8 is a flow-chart diagram which illustrates a CIRS decoding method, according to the present invention, that may be used with the circuitry shown in FIG. 7.

DETAILED DESCRIPTION

The exemplary embodiments of the invention described below are linear in the number of errors in the sector, not in the number of passes over the matrix needed to correct the errors. The improved method processes the data values in the sector through the same number of passes of both the P and Q decoding algorithms. After the first pass, however, the improved method only calculates an error syndrome for a subset of the sequences. The sequences in this subset are those which are determined by the method to possibly contain an error. While the present invention is described in terms of a cross interleaved Reed Solomon error correcting code, it is contemplated that it may be practiced using other types of error correcting codes applied to the data sequences, such that different codes are applied to respective data sequences having common elements.

FIG. 7 is a block diagram of a computer system which includes an embodiment of the invention. The system includes a microprocessor 710, for example a 68020 microprocessor manufactured by Motorola, Inc. The microprocessor 710 is coupled to a memory 712 via a system bus 720. The system bus 720 also couples a CD-ROM direct memory access (DMA) controller 716 and a CD-ROM command and status controller 714 to the microprocessor 710 and memory 712. A CD-ROM drive 718 is coupled to provide data to the DMA controller 716 and to receive commands from, and to provide status and subcode data to the controller 714.

In the exemplary embodiment of the invention, the error correction algorithm is implemented as a software program which runs on the microprocessor 710. As a data sector is read from the drive 718 responsive to a command received from the controller 714, the DMA controller writes the sector directly into the memory 712 using a direct memory access (DMA) technique.

Once the sector is in memory, the microprocessor 710 is interrupted and performs the error correction process illustrated by the flow-chart diagram of FIG. 8. The first step in this process, step 810, initializes two arrays, PErr and QErr. The PErr array includes one boolean value for each of the P sequences while the QErr array includes one boolean value for each of the Q sequences. At step 810, all of these boolean values are set to a TRUE state. As described below, these boolean values determine whether the respective parity check matrix, HP or HQ, is applied to the sequence to calculate a new syndrome value for the sequence.

Step 812 is executed after step 810. In this step, the microprocessor 710 examines each value of PErr[i] from i=0 to 42. If one of the values, i, is TRUE, the parity check matrix HP is applied to the ith P sequence of the retrieved sector to generate a syndrome value SP[i]. As with the conventional system described above, only the values in the MSB plane or LSB plane are processed at any one time.

If the calculated syndrome SP[i] indicates that the sequence contains multiple errors, an error state of TRUE is stored in PErr[i]. If the syndrome indicates that only a single error exists then that error is corrected and an error state of FALSE is stored in PErr[i]. PErr[i] is also set to FALSE If the syndrome has a value of zero.

Whenever a one-bit error is corrected by applying the parity check matrix to one of the P sequences, the microprocessor 710, at step 812, determines which Q sequence, j, contains the byte that was corrected. It then sets the error state of QErr[j] to TRUE to force error correction of the Q sequence during the Q-code pass of the algorithm, described below.

After each of the P sequences which have TRUE values of PErr[i] have been processed through step 812, control is transferred to step 814 in which the same process is applied to each of the Q sequences. As in the P-code evaluation process, if the calculated syndrome value SQ[j] is zero, QErr[j] is set to FALSE; if SQ[j] indicates a multi-bit error in sequence j, then QErr[j] is set to TRUE; and if SQ[j] indicates the location of a one-bit error, the error is corrected and QErr[j] is set to FALSE.

If the microprocessor 710, during step 814, corrects a one-bit error in any of the Q sequences, it determines which P sequence, i, contains the corrected byte and sets the corresponding value of PErr[i] to TRUE.

After step 814, the microprocessor 710 executes step 816. In this step, if all of the PErr values and all of the QErr values are FALSE, then the error correction program returns an indication that the decode operation was successful. If any of these values is false, however, step 818 is executed which increments the iteration count.

Step 820 compares the incremented iteration count to a maximum count. If the iteration count is less than the maximum, control is transferred to step 812 to process each of the erroneous P and Q sequences, as indicated by the corresponding elements of the arrays PErr and QErr, through the error correction algorithm. If the incremented count is not less than the maximum count, the process returns control to the calling process with an indication that the processed plane includes errors which cannot be corrected.

The optimized algorithm described above has two significant differences from the conventional algorithm described with reference to FIGS. 1-6. First, the optimized algorithm does not process every P sequence and every Q sequence during each pass through the error correction process and second, whenever an error is corrected in any P or Q sequence the affected Q or P sequence, respectively, is marked for reevaluation during the next pass.

The first of these differences converts the algorithm from one which is linear in the number of passes needed to correct the errors to one which is linear in the number of errors. This difference is illustrated by Table 2.

TABLE 2

| Errors | 0 | 1 | 2 | 4 | 8 | 12 |
|---|---|---|---|---|---|---|
| Iterations | 1 | 1 | 2 | 3 | 4 | 5 |
| Normalized Execution Time | 1.00 | 1.00 | 1.91 | 2.88 | 3.84 | 4.79 |
| Optimized Execution Time | 1.00 | 1.00 | 1.07 | 1.15 | 1.35 | 1.60 |
| Relative Improvement | 0.00 | 0.00 | 1.78 | 2.50 | 2.84 | 2.98 |

Because the optimized algorithm uses many fewer computations than the conventional algorithm, it can be run in real-time on the host microprocessor 710. This eliminates the need for costly special purpose processors such as the P decoder 514 and Q decoder 516 of FIG. 5.

The second difference between the two methods ensures that if any sequence has multiple errors and yet has a zero-valued syndrome, that sequence will be reevaluated if any of the errors is corrected through the processing of a cross-interleaved sequence.

The present invention has been described in terms of a software implemented error correction algorithm. It is contemplated, however, that it may be implemented in one or more special purpose processors as well.

While the present invention has been described in terms of an exemplary embodiment it is contemplated that it may be practiced as outlined above within the spirit and scope of the appended claims.

I claim:

1. A method for efficiently decoding data which has been encoded in a first set of sequences and a second set of sequences according to an error correction encoding technique, each of the sequences in said first set and said second set having common members with sequences in said second set and said first set, respectively; the method comprising the steps of:
   a) processing each sequence in the first set of sequences to correct any errors in members of a sequence which can be corrected by decoding the error correction encoded data; and
   b) only for each member of a sequence of the first set that has been corrected:
      determining which sequence in the second set of sequences includes the member containing the corrected error; and
      marking the determined sequence in the second set for evaluation during subsequent error correction processing of the second set.

2. An apparatus for efficiently decoding data which has been encoded in a first set of sequences and a second set of sequences according to an error correction encoding technique, each of the sequences in said first set and said second set having common members with sequences in said second set and said first set, respectively, the apparatus comprising:

error correction means for processing one of the sequences in the first set of sequences to correct an error in one of the members of the sequence according to the error correction encoding technique;

means for determining which sequence in the second set of sequences includes the one member containing the corrected error; and means for marking only the determined sequence in the second set for evaluation during subsequent error correction processing of the second set.

3. A method for efficiently decoding data which has been encoded in a first set of sequences and a second set of sequences according to an error correction encoding technique, each of the sequences in said first set and said second set having common members with sequences in said second set and said first set, respectively, wherein the error correction encoding technique applied to each of the sequences is able to correct errors in N-bits or less in the sequence and to detect but not correct errors in N+1 to M bits, and is not able to detect errors in more than M-bits in the sequence, where N and M are integers and M is greater than N, the method comprising the steps of:

a) processing each sequence in the first set of sequences to correct any errors in members of a sequence which can be corrected by decoding the error correction encoded data including generating a respective syndrome value for each sequence in the first set of sequences, the syndrome having a value of zero for sequences which have no errors and for at least one sequence which has errors in more than M bits and having a non-zero value for sequences which have errors in 1 to M bits;

marking all sequences having zero-valued syndrome values to be skipped during subsequent error correction processing of the sequences of the first set;

using said respective syndrome values to correct errors in sequences having errors in between 1 and N bits and marking the sequences containing the corrected errors to be skipped during subsequent error correction processing of the sequences of the first set; and using said respective syndrome values to mark sequences containing errors in between N+1 and M bits for evaluation during the subsequent error correction processing of the sequences of the first set; and b) for each member of a sequence of the first set that has been corrected:

determining which sequence in the second set of sequences includes the member containing the corrected error;

marking the determined sequence in the second set for evaluation during subsequent error correction processing of the second set.

4. The method of claim 3 further including the steps of:

generating a respective syndrome value for each sequence in the second set of sequences, the syndrome value being zero for sequences which have no errors and for sequences which have errors in more than M bits and having a non-zero value for sequences which have errors in between 1 to M bits;

marking all sequences having zero-valued syndromes to be skipped during subsequent error correction processing of the sequences of the second set;

using said respective syndrome values to correct errors in sequences having errors in between 1 and N bits and marking the sequences which contain the corrected errors as to be skipped during subsequent error correction processing of the sequences of the second set;

using said respective syndrome values to mark sequences containing errors in between N+1 and M bits for evaluation during the subsequent error correction processing of the sequences of the second set; and for each error in a member of one of the sequences of the second set that has been corrected:

determining which sequence in the first set of sequences includes the member containing the corrected error; and marking the determined sequence in the first set for evaluation during subsequent error correction processing of the first set.

5. A method according to claim 4 further including the step of performing a further error correction processing of the sequences in the first set and of the sequences in the second set, including the step of calculating a respective syndrome value for only the sequences which are marked for evaluation and not for the sequences which are marked to be skipped.

6. An apparatus for efficiently decoding data which has been encoded in a first set of sequences and a second set of sequences according to an error correction encoding technique, each of the sequences in said first set and said second set having common members with sequences in said second set and said first set, respectively, wherein the error correction means is able to correct errors in N-bits or less in the sequence and to detect but not correct errors in N+1 to M bits, and is not able to detect errors in more than M-bits in the sequence, where N and M are integers and M is greater than N, the apparatus comprising:

error correction means for processing one of the sequences in the first set of sequences to correct an error in one of the members of the sequence according to the error correction encoding technique including:

means for generating a syndrome value for each sequence in the first set of sequences, the syndrome having a value of zero for sequences which have no errors and for at least one sequence which has errors in more than M bits and having a non-zero value for sequences which have errors in 1 to M bits;

means for marking all sequences having zero-valued syndromes to be skipped during subsequent error correction processing of the sequences of the first set;

means, responsive to the generated syndrome values, for correcting errors in sequences having errors in between 1 and N bits and for marking the sequences containing the corrected errors to be skipped during subsequent error correction processing of the sequences of the first set; and means, responsive to the generated syndrome values, for marking sequences containing errors in between N+1 and M bits for evaluation during the subsequent error correction processing of the sequences of the first set;

means for determining which sequence in the second set of sequences includes the one member containing the corrected error; and means for marking the determined sequence in the second set for evaluation during subsequent error correction processing of the second set.

7. An apparatus according to claim 6 wherein:

the data sequences are cross interleaved such that one of the sequences in the first set has at least one common member with a sequence in the second set; and the data in the first and second sets of sequences are encoded using respective Reed Solomon error correction encoding techniques.

* * * * *